(12) United States Patent
Jiang et al.

(10) Patent No.: US 7,572,733 B2
(45) Date of Patent: *Aug. 11, 2009

(54) GAS SWITCHING DURING AN ETCH PROCESS TO MODULATE THE CHARACTERISTICS OF THE ETCH

(75) Inventors: Ping Jiang, Plano, TX (US); Francis Celii, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/923,852

(22) Filed: Oct. 25, 2007

(65) Prior Publication Data

US 2008/0090423 A1     Apr. 17, 2008

Related U.S. Application Data

(63) Continuation of application No. 11/420,405, filed on May 25, 2006, now Pat. No. 7,300,878.

(51) Int. Cl.
*H01L 21/302* (2006.01)

(52) U.S. Cl. .......... 438/695; 438/696; 438/743
(58) Field of Classification Search .......... 438/695, 438/696, 743
See application file for complete search history.

(56) References Cited

U.S. PATENT DOCUMENTS

| 7,300,878 B1 * | 11/2007 | Jiang et al. ............ 438/695 |
| 2003/0211753 A1 * | 11/2003 | Nallan et al. ............ 438/719 |
| 2004/0072430 A1 | 4/2004 | Huang et al. |
| 2006/0199370 A1 | 9/2006 | Dai et al. |
| 2007/0199922 A1 * | 8/2007 | Shen et al. ............ 216/76 |
| 2007/0202700 A1 * | 8/2007 | Leucke et al. ............ 438/689 |

* cited by examiner

*Primary Examiner*—Binh X Tran
(74) *Attorney, Agent, or Firm*—Jacqueline J. Garner; Wade J. Brady, III; Frederick J. Telecky, Jr.

(57) ABSTRACT

Gas switching is used during an etch process to modulate the characteristics of the etch. The etch process comprises a sequence of at least three steps, wherein the sequence is repeated at least once. For example, the first step may result in a high etch rate of oxide (108) while the second step is a polymer coating steps and the third step results in a low etch rate of oxide and high etch rate of another material (114) and/or sputtering.

12 Claims, 3 Drawing Sheets

GAS SWITCHING DURING AN ETCH PROCESS TO MODULATE THE CHARACTERISTICS OF THE ETCH

This is a continuation application of Ser. No. 11/420,405 filed May 25, 2006, now U.S. Pat. No. 7,300,878.

FIELD OF THE INVENTION

The invention is generally related to the field of semiconductor device fabrication and more specifically to dual damascene trench etching.

BACKGROUND OF THE INVENTION

As the density of semiconductor devices increases, the demands on interconnect layers for connecting the semiconductor devices to each other also increase. Therefore, there is a desire to switch from the traditional aluminum metal interconnects to copper interconnects. Unfortunately, suitable copper etches for a semiconductor fabrication environment are not readily available. To overcome the copper etch problem, damascene processes have been developed.

In a conventional interconnect process, the aluminum (and any barrier metals) are deposited, patterned, and etched to form the interconnect lines. Then, an interlevel dielectric (ILD) is deposited and planarized. In a damascene process, the ILD is formed first. The ILD is then patterned and etched. The metal is then deposited over the structure and then chemically-mechanically polished to remove the metal from over the ILD, leaving metal interconnect lines. A metal etch is thereby avoided.

One prior art damascene process, a dual damascene process, is described with reference to FIGS. 1A-E. Referring to FIG. 1A, a silicon nitride layer 12 is deposited over a semiconductor body 10. Semiconductor body 10 will have been processed through a first metal interconnect layer. A via level dielectric 14 is deposited over silicon nitride layer 12. Via dielectric layer 14 comprises FSG (fluorine-doped silicate glass). Another silicon nitride layer 18 is deposited over via level dielectric 14 and a second, trench level dielectric 20 is deposited over silicon nitride layer 18. A via 22 is then patterned and etched through the trench level dielectric 20, silicon nitride layer 18 and via level dielectric 14. Silicon nitride layer 12 is used as a via etch-stop.

Referring to FIG. 1B, a spin-on organic BARC (bottom anti-reflection coating) 24 is deposited to fill a portion of via 22. The result is approximately 600 Å of BARC over dielectric 20 and a thickness of ~2000-2500 Å inside the via 22. BARC 24 protects via 22 during the subsequent trench etch. Next, the trench pattern 26 is formed on the structure as shown in FIG. 1C. Trench pattern 26 exposes areas of trench level dielectric 20 (with about 600 Å of BARC on top of dielectric 20) where the metal interconnect lines are desired. Referring to FIG. 1D, the trench etch to remove portions of FSG layer 20 is performed. Oxide ridges 28 may undesirably form on the edges of via 22. Pattern 26 is removed as shown in FIG. 1E. Oxide ridges impair device reliability due to the fact that it is difficult to ensure that a metal barrier completely covers the oxide ridges.

Newer technologies are switching to even lower-k dielectrics such as organo-silicate glass (OSG) or ultra-low-k films in place of FSG. Dual damascene processes for working with the newer dielectrics are needed.

SUMMARY OF THE INVENTION

The invention uses gas switching during an etch process to modulate the characteristics of the etch. The etch process comprises a sequence of at least three sub-steps that is repeated at least once. For example, the sequence may include a primary etch step that results in a high etch rate of oxide, a polymer coating step that helps protect the trench resist and feature sidewalls, and a ridge removal step that results in a lower etch rate of oxide and higher etch rate of the via plug material.

An advantage of the invention is providing an etch process that has a high etch rate, good CD and profile control, high selectivity, and good defect control.

This and other advantages will be apparent to those of ordinary skill in the art having reference to the specification in conjunction with the drawings.

DETAILED DESCRIPTION OF THE EMBODIMENTS

The invention will now be described in conjunction with a dual damascene copper interconnect process. It will be apparent to those of ordinary skill having reference to this specification that the benefits of the invention may be applied to other etch applications such as gate etch/shallow trench isolation etch or contact/via etch to expand process margins and to achieve better etch results.

A fabrication process according to an embodiment of the invention will now be discussed with reference to FIGS. 2A-2E. A semiconductor body 100 is processed through the formation of a first interconnect layer 102 as is known in the art. (Although referred to herein as the first interconnect layer 102, layer 102 may be any interconnect layer except the uppermost interconnect layer.) A via etch-stop layer 104 is deposited over the first interconnect layer 102. Etch-stop layer 104 typically comprises silicon carbide, but other suitable etch-stop layers are known in the art (e.g., silicon nitride). As an example, the thickness of etch-stop layer 104 may be on the order of 600 Å (e.g., 300 Å-1000 Å).

Figure 1A:
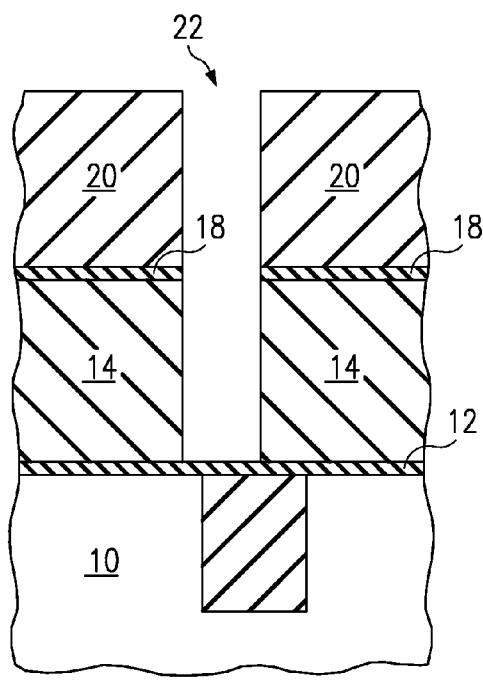
FIGS. 1A-1E are cross-sectional diagrams of a prior art dual damascene process at various stages of fabrication.
Figure 1B:
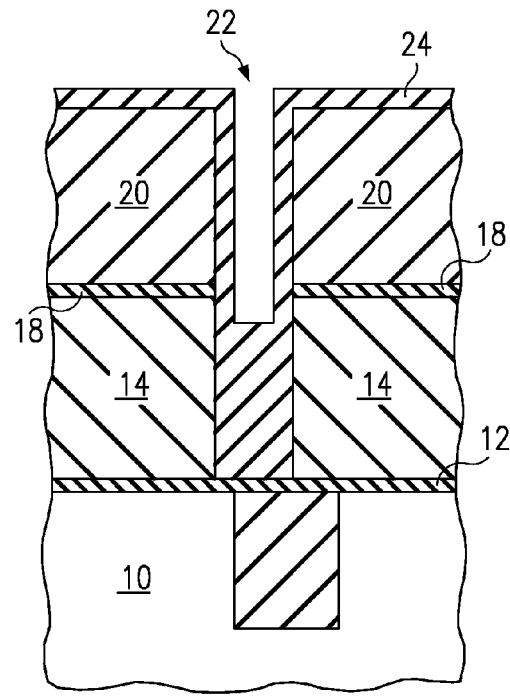
Figure 1C:
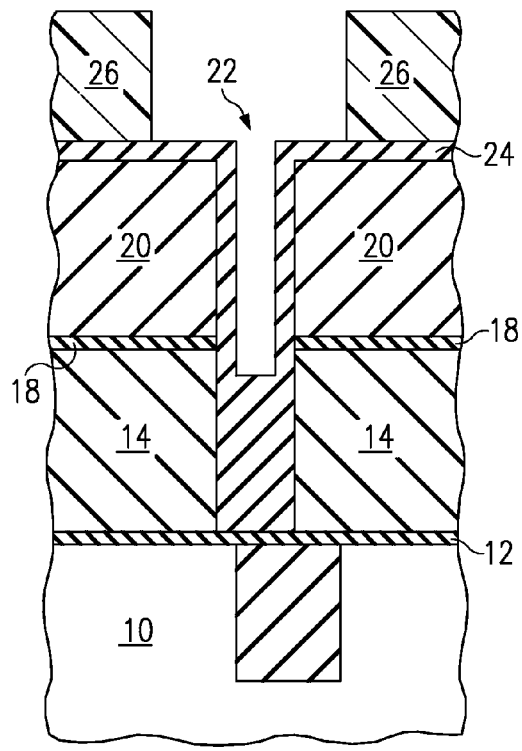
Figure 1D:
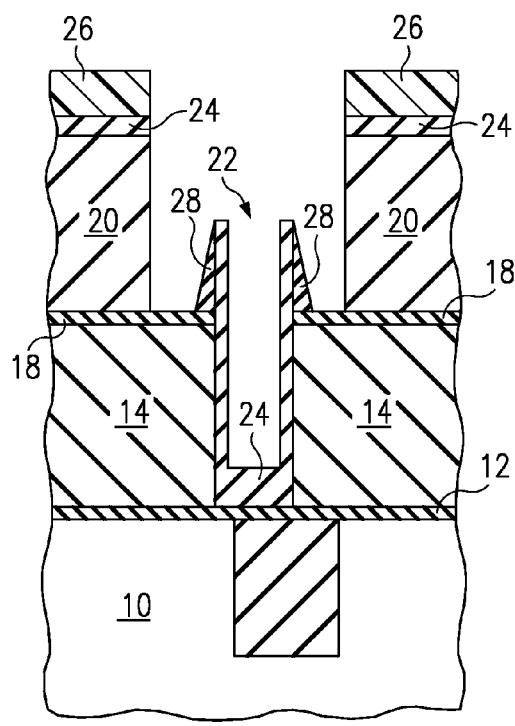
Figure 1E:
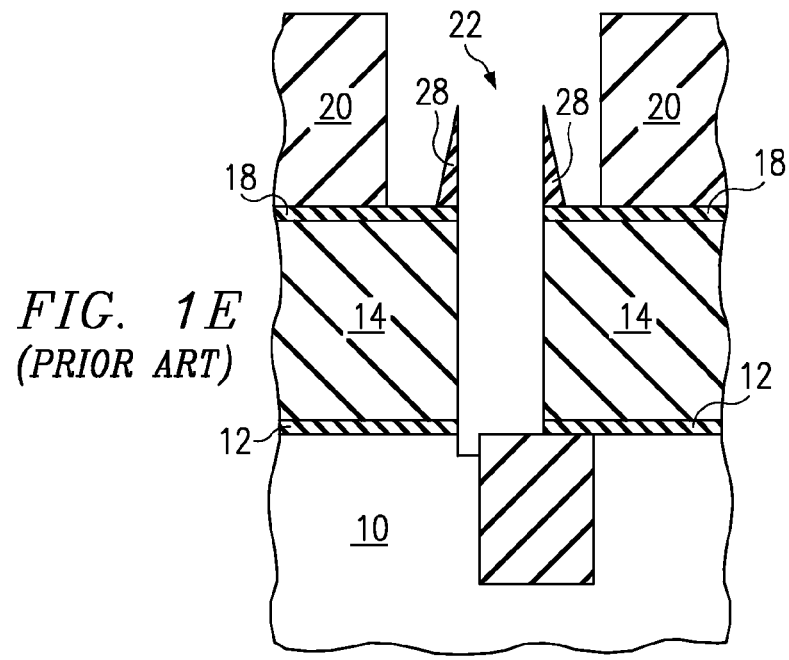
Figure 2A:
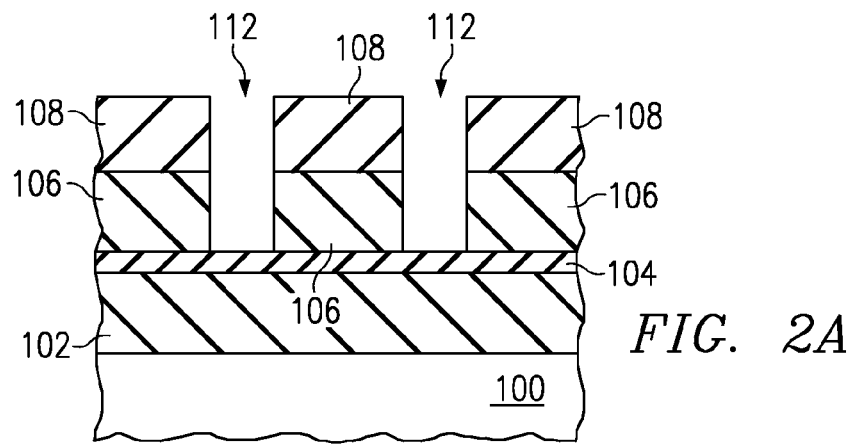
FIGS. 2A-2E are cross-sectional diagrams of a dual damascene process according to the invention at various stages of fabrication.

The via level dielectric 106 (sometimes referred to as interlevel dielectric—ILD) and trench level dielectric 108 (sometimes referred to as intrametal dielectric—IMD) are formed over etch-stop layer 104. As shown in FIG. 2A, ILD 106 and IMD 108 can be a single layer. In the preferred embodiment, OSG (organo-silicate glass) is the material used for ILD 106 and IMD 108. OSG is a low-k material having a dielectric constant in the range of 2.7~3.0. Alternatively, ILD 106 and IMD 108 may comprise tetra-ethyl-ortho-silicate (TEOS), fluorine doped silicate glass, another low-k (k<3.0) or an ultra-low-k (k≦2.5) dielectric. The etch chemistries described hereinbelow are optimized for an OSG dielectric. The combined thickness of ILD 106 and IMD 108 may be approximately 5000 Å (e.g., 2500 Å-10,000 Å).

A trench etch-stop layer is not necessary between ILD 106 and IMD 108. However, one could be included if desired. Eliminating, the etch-stop layer between the ILD 106 and IMD 108 has the advantage of reducing parasitic capacitance.

Sometimes a capping layer is formed over IMD 108. As an example, oxide capping layer may be deposited using a plasma enhanced tetraethylorthosilicate (PETEOS) process. The thickness of oxide capping layer is approximately 1000 Å (e.g., 200 Å-3000 Å). Silicon nitride could also be used as a capping layer. It should be noted that a BARC layer is often used under the resist for both via and trench pattern. In the preferred embodiment, no capping layer or hardmask is used.

Referring to FIG. 2A, vias 112 are etched through IMD 108 and ILD 106. The via etch stops on etch-stop layer 104. Vias 112 are formed in areas where connection is desired between two metal interconnect layers. If an additional etch-stop layer was included between IMD 108 and ILD 106, the via etch also etches through this additional etch-stop layer. In the preferred embodiment, the via etch chemistry comprises $C_4F_8$, $N_2$ and CO.

Figure 2B:
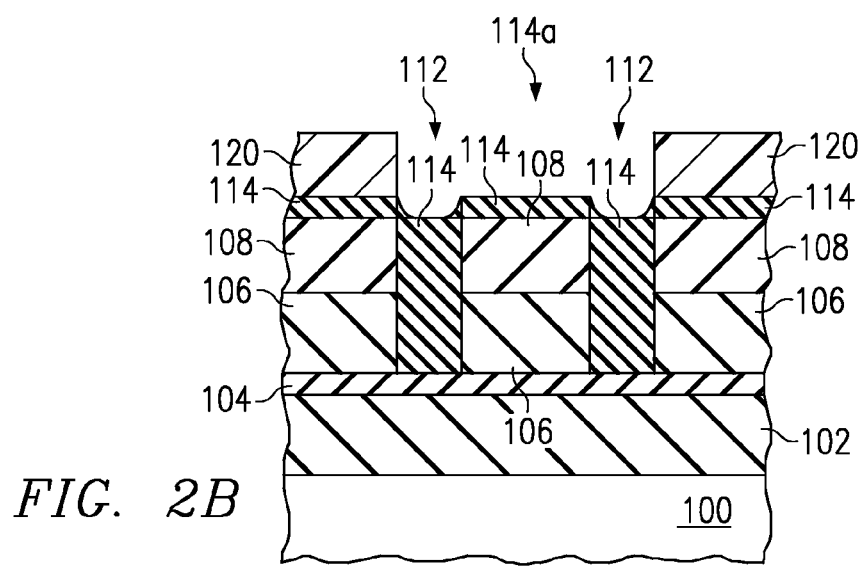

Referring to FIG. 2B, a spin-on BARC 114 is coated to fill at least portion of via 112. FIG. 2B shows a full-fill via. The result is approximately 850 Å of BARC over IMD 108 and a thickness of ~4500 Å-7000 Å inside the via 112. (The BARC thickness inside the via varies with the via density.) BARC 114 protects the bottom of via 112 during the subsequent trench etch.

Still referring to FIG. 2B, the trench resist pattern 120 is formed. Trench pattern 120 exposes the areas where metal interconnect lines of a second or subsequent metal interconnect layer are desired.

Figure 2C:
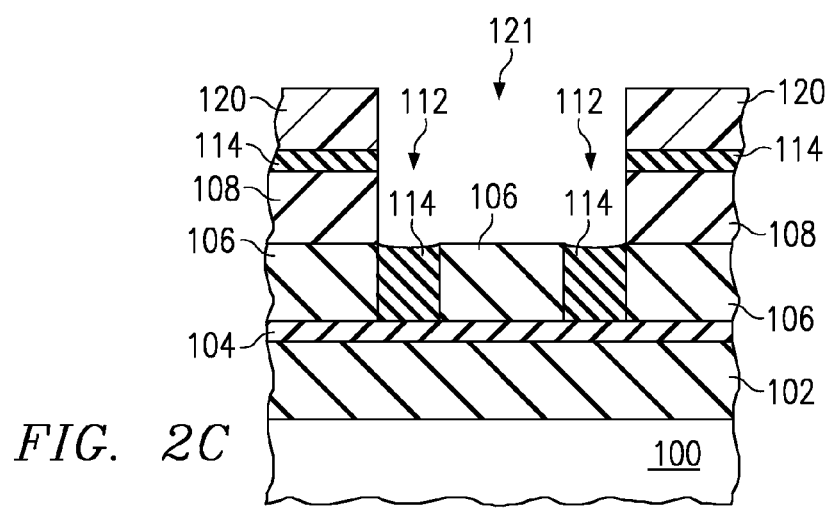

Next, the trench etch is performed to etch IMD 108 as shown in FIG. 2C. The trench etch is a gas switching process to modulate the etch characteristics. The gas switching process uses a sequence of at least three sub-steps (e.g., an oxide etch step, a polymer coating step, and a ridge removal step). The sequence is repeated at least once and preferably three or more times. Additional steps may be included and repeated at least once. At least one process gas is changed for each sub-step in order to modulate the etch characteristics.

In a preferred embodiment, the first step is an oxide "etching" step that preferentially etches the IMD 108 with respect to the BARC fill 114. The second step is a "polymer coating" step that uses a polymerizing fluorocarbon gas or gases. The polymer coating step protects the resist 120 surface and the etched sidewall to help reduce LER (line-edge-roughness) and protects the via 112 corner thus reducing via flaring. The third step is a short "ashing/sputtering" step that preferentially etches the BARC fill 114 with respect to etching the oxide of the IMD and sputters/removes any ridges that may begin to form during the oxide etching step. Each step has a different etch selectivity ratio. Differing etch selectivity ratios may be obtained by changing one or more of the gases used, changing the flow ratios, and/or changing the RF power for each step. The remaining process parameters (e.g., pressure, chuck temperature, gap, etc.) may or may not remain the same.

In one example, after an initial etch step to remove the exposed portion 114a of BARC layer over IMD 108, a short oxide etching step is performed. The oxide etching step is tuned to provide a high etch rate for the IMD 108. A short polymer coating step is then performed using a low power with a polymerizing fluorocarbon gas (or gases) such as $CH_2F_2$, $CH_3F$, $CHF_3$, $C_4F_6$, or $C_5F_8$. The polymer coating step protects the resist 120 surface, the sidewall, and the via corner. A short ashing/sputtering step is then performed. The oxide etch step, polymer coating step, and ashing/sputtering steps each use a different gas chemistry (i.e., at least one process gas of the gas chemistry is different). The sputtering step is optimized to prevent the formation of oxide ridges that would result from using the oxide etching step alone. For example, the sputtering step may have a lower IMD etch rate and higher BARC etch rate or higher inert gas flow. The oxide etch, polymer coating, and sputtering steps are repeated at least once.

A preferred set of etch parameters for etching a trench in OSG are given in Table 1. The initial step is used to etch the BARC 114a. The First sub-step is an oxide etching step that preferentially removes the IMD 108 with respect to BARC 114. The Second sub-step is a polymer coating step and the Third sub-step is a sputtering step that preferentially etches BARC 114 with respect to the IMD 108 and removes ridges formed during the first sub-step. In one preferred embodiment, the First, Second, and Third sub-steps are repeated 3 times for a total of 57 seconds.

TABLE I

Preferred Etch Sequence

| Step | Pressure | Power | Gas Species | Gas species | Gas species | Temp. | Time |
|---|---|---|---|---|---|---|---|
| Initial | 40 mT | 1400 W | 80 $CF_4$ | 20 $O_2$ | 160 Ar | 60 C./40 C. | 20 s |
| First | 40 mT | 1500 W | 10 $C_4F_8$ | 300 $N_2$ | 100 Ar | 60 C./40 C. | 10 s |
| Second | 50 mT | 300 W | 20 $CH_2F_2$ | 200 Ar | | 60 C./40 C. | 4 s |
| Third | 40 mT | 500 W | 5 $O_2$ | 100 $N_2$ | 400 Ar | 60 C./40 C. | 5 s |

As in the preferred example above, the First, Second, and Third sub-steps may differ by one or more gas species, flow rate, or pressure. The remaining process parameters may or may not remain the same. In the above example, power, flow rate, and time are changed in addition to changing a gas species. The First sub-step above has a high etch rate of oxide as in a traditional "etching" step. The Second sub-step provides a temporary polymer coating to protect resist surface and via corners. The Third sub-step may be more of an "ashing" with high etch rate of organic BARC inside the vias and very low etch rate of oxide and a "sputtering" with a high flow rate of inert gas to remove ridges. The modulated etch process of Table I can reduce or eliminate oxide ridges with a full BARC-fill of the vias. It can also achieve good sidewall profile and CD control for the OSG trench etch. The Third sub-step is preferably shorter than the First sub-step so that oxide ridge formation can be prevented without too much resist loss.

In another preferred embodiment, the order of the sub-steps in the sequence differs from the above example. In this embodiment, the first step in the sequence is a polymer coating step. The second step is a spuffering/ridge removal step and the third step is an oxide etching step.

In yet another preferred embodiment, the sub-steps in the sequence differ from the above example. In this embodiment, the first sub-step in the sequence is a plasma treatment step that protects the low-k/ultra-low-k film during ashing. The second sub-step is an ashing/resist removal step. The third sub-step is a plasma curing step that cures the damage done to the low-k/ultra-low-k film by etching and ashing. The sequence may be performed in a reactive ion etch (RIE) tool such as a one using dipole ring magnets or a super capacitively coupled module, both available from Tokyo Electron Limited (TEL), a capacitively coupled plasma from Lam Research Corporation or Applied Materials, Inc. or other inductively coupled plasma (ICP) etchers.

Figure 2D:
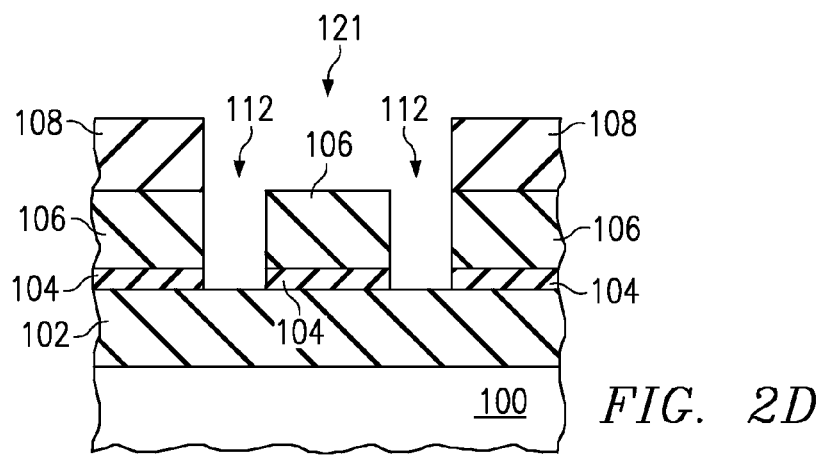

Referring to FIG. 2D, the resist and BARC from trench pattern 120 are removed, for example, by ashing. Next, an etch-stop etch is performed to remove the etch-stop layer at the bottom of the vias. (If the capping layer is thin (e.g., <500 A), it can be removed during etch-stop layer etch. However, if the capping layer is >500 A, it is removed during metal CMP.)

Figure 2E:
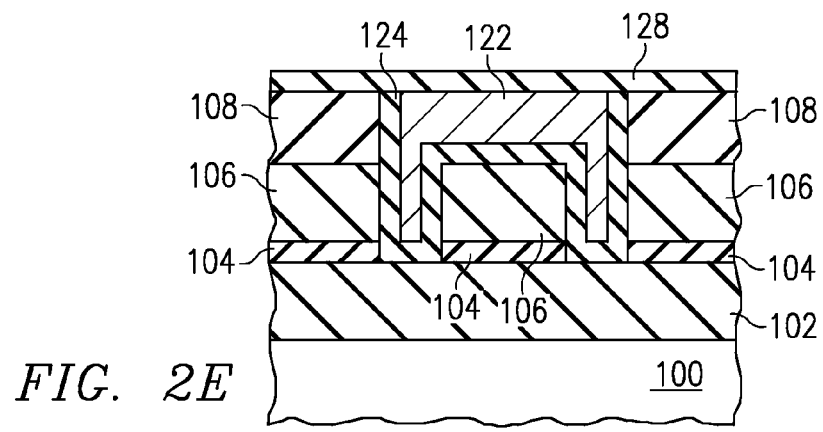

Processing then continues with the formation of the second metal interconnect layer 122, as shown in FIG. 2E. (Although referred to as the second metal interconnect layer, layer 122 can be any metal interconnect layer other than the lowest interconnect layer.) Typically, a barrier layer 124, such as tantalum-nitride (TaN) is deposited first. Due to the fact that no oxide ridges are formed, it is fairly easy to form a continuous barrier layer 124 in the trench/via. This advantage also increases the process margin. The purpose of the barrier layer is to prevent diffusion of the subsequently formed metal into the IMD/ILD. Breaks in the barrier layer allow metal diffusion and thus reduce yield and reliability. The invention thus improves both the yield and reliability by preventing the formation of oxide ridges and reducing defects in the via.

After the barrier layer 124 is deposited, a copper seed layer is typically formed. This is followed by the formation of the copper interconnect 122 and a top nitride ($Si_3N_4$) or silicon carbide (SiC) capping layer 128. The above process can then be repeated to form subsequent metal interconnect layers.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. For example, the etch chemistries of the primary and secondary steps may be reversed such that the primary step etches BARC faster and the secondary step etches OSG faster. It is therefore intended that the appended claims encompass any such modifications or embodiments.

The invention claimed is:

1. A method of fabricating an integrated circuit, comprising the steps of:
   providing a semiconductor body having a dielectric formed thereover;
   etching a via in said dielectric;
   filling said via with a material;
   forming a trench pattern over said dielectric;
   etching a trench in said dielectric using a sequence comprising at least an oxide etching step; a polymer coating step, and an ashing and sputtering step, wherein said sequence is repeated at least once; and
   removing said trench pattern.

2. The method of claim 1, wherein said dielectric comprise a material selected from the group consisting of tetra-ethyl-ortho-silicate (TEOS), fluorine doped silicate glass, low-k dielectrics, and ultra-low-k dielectric.

3. The method of claim 1, wherein said oxide etching step uses a first gas chemistry, said polymer coating step uses a second, distinct gas chemistry, and said sputtering step uses a third, distinct, gas chemistry.

4. The method of claim 3, wherein said first gas chemistry provides a higher etch rate for said dielectric and said third gas chemistry provides a lower etch rate for said dielectric.

5. The method of claim 3, wherein said first gas chemistry comprises $C_4F_8$, nitrogen, and argon, said second gas chemistry comprises a polymerizing fluorocarbon gas and argon, and said third gas chemistry comprises $O_2$ and one or more gases selected from the group consisting of nitrogen and argon.

6. The method of claim 5, wherein said polymerizing fluorocarbon gas comprises $CH_2F_2$.

7. A method of fabricating an integrated circuit, comprising the steps of:
   providing a semiconductor body having an interlevel dielectric (ILD) and intrametal dielectric (IMD) formed thereover;
   etching a via in said IMD and in said ILD;
   filling said via with a material;
   forming a trench resist pattern over said IMD;
   etching a trench in said IMD using an etch sequence comprising:
      supplying a first gas chemistry comprising at least one first process gas;
      changing said first gas chemistry to a second gas chemistry by replacing said at least one first process gas with at least one second process gas; and
      changing said second gas chemistry to a third gas chemistry by replacing said at least one second process gas with at least one third process gas, wherein said at least one first process gas, said at least one second process gas and said at least one third process gas are distinct from each other,
   wherein said etch sequence is repeated at least once; and
   then, removing trench resist pattern and said material.

8. The method of claim 7, wherein the etch sequence is repeated at least three times.

9. The method of claim 7, wherein said step of supplying the first gas chemistry comprises etching said IMD preferentially with respect to said material, wherein the at least one second process gas comprises a polymerizing fluorocarbon gas, and wherein said step of changing the second gas chemistry to the third gas chemistry comprises an ashing and sputtering effect.

10. The method of claim 9, wherein said polymerizing gas is selected from the group consisting of $CH_2F_2$, $CH_3F$, $CHF_3$, $C_4F_6$, and $C_5F_8$.

11. The method of claim 7, wherein the at least one first process gas comprises a polymerizing fluorocarbon gas, wherein the step of changing the first gas chemistry to the second gas chemistry comprises an ashing and sputtering effect, and wherein the step of supplying the third gas chemistry comprises etching the IMD preferentially with respect to the material.

12. The method of claim 11, wherein said polymerizing gas is selected from the group consisting of $CH_2F_2$, $CH_3F$, $CHF_3$, $C_4F_6$, and $C_5F_8$.

* * * * *